United States Patent
Ku et al.

(10) Patent No.: US 10,483,226 B2
(45) Date of Patent: Nov. 19, 2019

(54) SEMICONDUCTOR DEVICE AND METHOD OF FORMING THE SAME

(71) Applicant: Taiwan Semiconductor Manufacturing Co., Ltd., Hsinchu (TW)

(72) Inventors: Chin-Yu Ku, Hsinchu (TW); Hon-Lin Huang, Hsinchu (TW); Chao-Yi Wang, Tainan (TW); Chen-Shien Chen, Hsinchu County (TW); Chien-Hung Kuo, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/957,919

(22) Filed: Apr. 20, 2018

(65) Prior Publication Data

US 2019/0326239 A1 Oct. 24, 2019

(51) Int. Cl.
*H01L 23/00* (2006.01)

(52) U.S. Cl.
CPC .............. *H01L 24/13* (2013.01); *H01L 24/11* (2013.01); *H01L 2224/10126* (2013.01); *H01L 2224/11001* (2013.01); *H01L 2224/11019* (2013.01); *H01L 2224/11424* (2013.01); *H01L 2224/11464* (2013.01); *H01L 2224/13082* (2013.01); *H01L 2224/13144* (2013.01); *H01L 2224/13155* (2013.01)

(58) Field of Classification Search
CPC . H01L 2224/11019; H01L 2224/11009; H01L 2224/81–2224/81002; H01L 2224/11001; H01L 2221/68318; H01L 2224/68381; H01L 24/11; H01L 2224/11–2224/11916; B81C 1/00666–1/00833; B81C 1/00476
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |

(Continued)

*Primary Examiner* — Charles D Garber
*Assistant Examiner* — Alia Sabur
(74) *Attorney, Agent, or Firm* — JCIPRNET

(57) ABSTRACT

A method of forming a semiconductor device is provided. A first substrate is provided with a conductive feature therein, a metal bump over the conductive feature and a passivation stack aside the metal bump. A first insulating layer is formed over the metal bump and the passivation stack. First and second patterning processes are performed to form first and second opening patterns in the first insulating layer. The metal bump is exposed by the second patterning process. A second substrate is provided with a second insulating layer thereon. The second substrate is bonded to the first substrate with the second insulating layer and the first insulating layer facing each other, so that the second insulating layer fills in the first and second opening patterns of the first insulating layer. The first insulating layer and a portion of the passivation stack are removed.

14 Claims, 15 Drawing Sheets

(56) References Cited

U.S. PATENT DOCUMENTS

| | | | |
|---|---|---|---|
| 9,496,189 B2 | 11/2016 | Yu et al. | |
| 9,666,502 B2 | 5/2017 | Chen et al. | |
| 9,735,131 B2 | 8/2017 | Su et al. | |
| 2013/0087908 A1* | 4/2013 | Yu | H01L 24/13 257/737 |
| 2016/0365332 A1* | 12/2016 | Kalnitsky | H01L 24/73 |
| 2018/0201504 A1* | 7/2018 | Dehe | H04R 19/005 |

* cited by examiner

SEMICONDUCTOR DEVICE AND METHOD OF FORMING THE SAME

BACKGROUND

The semiconductor integrated circuit (IC) industry has experienced rapid growth. Technological advances in IC materials and designs have produced generations of ICs, and each generation has smaller and more complex circuits than the previous generation. However, these advances have increased the complexity of processing and manufacturing ICs and, for these advances to be realized, similar developments in IC processing and manufacturing are needed. Although the existing semiconductor devices and the forming methods thereof have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
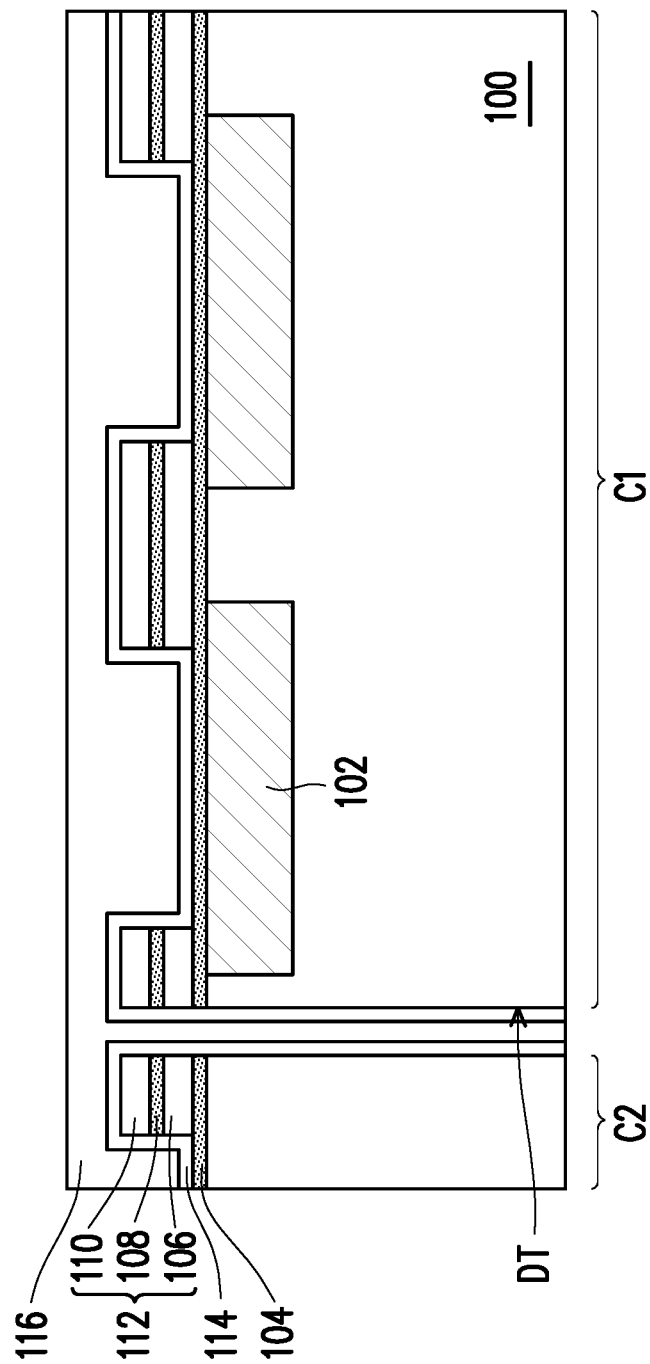
FIG. 1A to FIG. 1M are schematic cross-sectional views of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1M are schematic cross-sectional views of a method of forming a semiconductor device in accordance with some embodiments.

Referring to FIG. 1A, a first substrate 100 is provided with at least two chip regions C1 and C2 separated by a deep trench DT. In some embodiments, the first substrate 100 includes a silicon-containing substrate, a silicon-on-insulator (SOI) substrate, or a substrate formed of other suitable semiconductor materials. In some embodiments, the first substrate 100 has fins extending in a first direction, and gates disposed across the fins and extending in a second direction different from the first direction. In alternative embodiments, the first substrate 100 is a bulk substrate without fins, and has gates disposed in and/or on the first substrate 100. In some embodiments, the deep trench DT serves as a singulation area or a separating region from which the adjacent chip regions C1 and C2 are singulated or separated by a suitable or practicable means.

In some embodiments, the first substrate 100 has one or more conductive features 102 formed therein. In some embodiments, the conductive features 102 are patterns of a top metal (TME) layer of an interconnection structure over the gates. In some embodiments, the conductive features 102 are encapsulated by an insulating layer of the interconnection structure. The conductive features 102 may include copper or a suitable metal material.

In some embodiments, the first substrate 100 has an etch stop material layer 104 formed over the conductive features 102. The etch stop material layer 104 may include silicon nitride or a suitable insulating material. In some embodiments, the first substrate 100 has one or more stacked structures 112 formed separately over the etch stop material layer 104. In some embodiments, each of the stacked structures 112 includes at least one first dielectric layer and at least one second dielectric layer made by different materials and stacked alternately on one another. The first dielectric layer may be formed of a material having a high etch selectivity with respect to the second dielectric layer.

In some embodiments, each of the stacked structures 112 is a sandwich structure including first dielectric layers 106 and 110 and a second dielectric layer 108 between the first dielectric layers 106 and 110. The first dielectric layers 106 and 110 may include silicon oxide or a suitable dielectric material, and the second dielectric layer 108 may include silicon nitride or a suitable dielectric material. In some embodiments, the thickness of the first dielectric layer 106 or 110 is about 2 to 10 times (e.g., about 4 to 6 times) the thickness of the second dielectric layer 108. For example, the thickness of the first dielectric layer 106 is about 0.2 um, the thickness of the second dielectric layer 108 is about 0.05 um, and the thickness of the first dielectric layer 110 is about 0.3 um.

In some embodiments, the first substrate 100 has a deep trench DT that penetrates through the first substrate 100, the etch stop material layer 104 and one of the stacked structures 112. In some embodiments, the deep trench DT is referred to as an insulating deep trench throughout the description, because the deep trench DT is subsequently filled with an insulating material.

In some embodiments, the first substrate 100 has a protection material layer 114 that is formed over the etch stop material layer 104, encapsulates the tops and sidewalls of the stacked structures 112 and covers the sidewall of the deep trench DT. The protection material layer 114 may include aluminum oxide or a suitable insulating material.

In some embodiments, the first substrate 100 has a cap material layer 116 that is formed over the protection material layer 114, fills in the gaps between the stacked structures 112 and fills up the deep trench DT. The cap material layer 116 may include silicon oxide (e.g., high aspect ratio process (HARP) oxide) or a suitable insulating material. HARP oxide may be produced by sub-atomospheric chemical vapor deposition (SACVD), which is a non-plasma based chemical vapor deposition (CVD) solution using ozone/TEOS chemistry to deposit an oxide in a high aspect ratio trench. An annealing may be needed to harden HARP oxide.

Figure 1B:
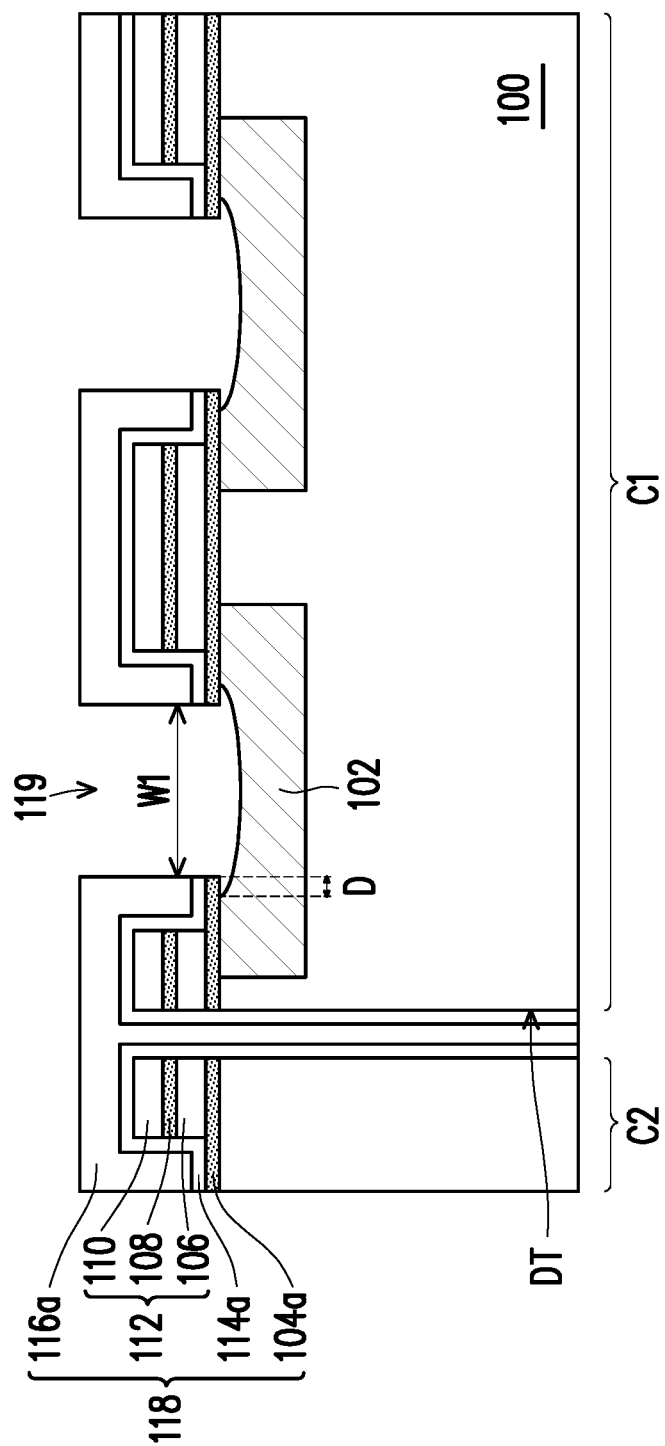

Referring to FIG. 1B, the cap material layer 116, the protection material layer 114 and the etch stop material layer 104 are patterned to form passivation stacks 118 and openings 119 between the passivation stacks 118. Specifically, each of the openings 119 is formed through the cap material layer 116, the protection material layer 114 and the etch stop material layer 104 and therefore exposes the corresponding conductive feature 102. In some embodiments, each of the passivation stacks 118 includes, from bottom to top, an etch stop layer 104a, a stacked structure 112, a protection layer 114a and a cap layer 116a. Specifically, in each passivation stack 118, the stacked structure 112 is disposed over the etch stop layer 104a, the cap layer 116a is disposed over the etch stop layer 104a and encapsulates the top and sidewall of the stacked structure 112, and the protection layer 114a is disposed between the cap layer 116a and stacked structure 112 and between the cap layer 116a and the etch stop layer 104a.

In some embodiments, the patterning operation of FIG. 1B includes performing photolithography and etching processes. In some embodiments, photoresist patterns serving as etch masks are formed over the cap material layer 116, an anisotropic etching (e.g., dry etching) is first performed to form openings with substantially vertical sidewalls, and an isotropic etching (e.g., wet etching) is then performed to widen the bottoms of the openings. In some embodiments, the isotropic etching (e.g., wet etching) may etch away the surface portions of the underlying conductive features 102, so that the openings 119 are formed with curved bottoms, and the bottom edges extend below the etch stop layers 104a of the adjacent passivation stacks 118. In some embodiments, the bottom edge of each opening 119 that extends a distance D below the adjacent passivation stack 118 from the sidewall of the opening 119. In some embodiments, the extending distance D of the bottom edge of the opening 119 and the width W1 of the opening 119 are in a ratio of about 1:3 to 1:15, such as about 1:6 to 1:8. For example, the extending distance D of the bottom edge of the opening 119 is about 0.3 um, and the width W1 of the opening 119 is about 2 um.

Figure 1C:
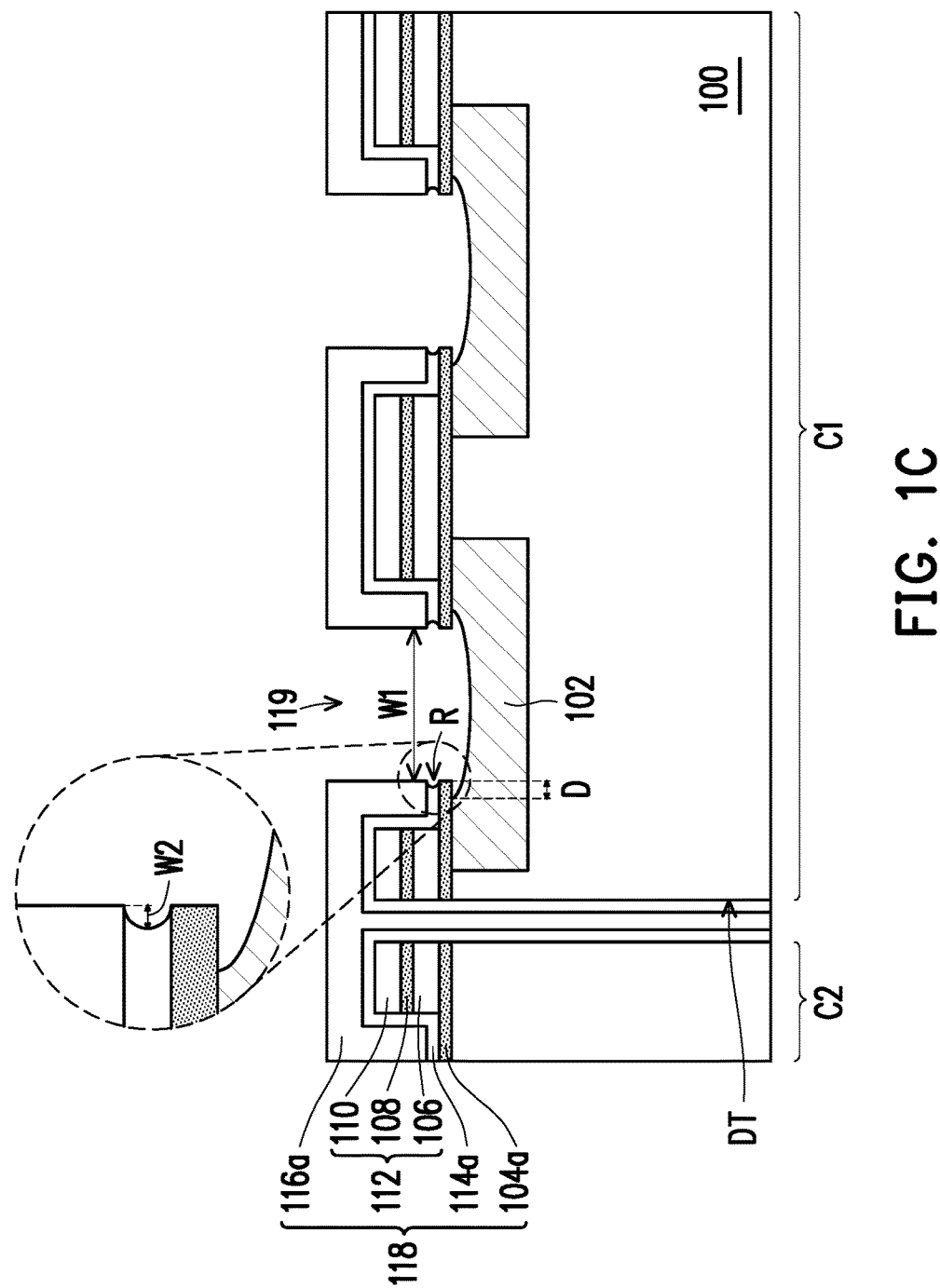

Referring to FIG. 1C, portions of the passivation stacks 118 are removed to form recesses R in the passivation stacks 118 adjacent to the corresponding openings 119. In some embodiments, the recesses R are configured to surround the corresponding openings 119. Specifically, portions of the protection layers 114a of the passivation stacks 118 exposed by the openings 119 are removed by a suitable etching (e.g., wet etching), so that the recesses R are formed with curved surfaces and surrounded by the remaining protection layers 114a, the overlying cap layers 116a and the underlying etch stop layers 104a.

In some embodiments, the thickness of the etch stop layer 104a is about 2 to 10 times (e.g., about 4 to 6 times) the thickness of the protection layer 114a. In some embodiments, the thickness of the cap layer 116a is about 15 to 40 times (e.g., about 22 to 25 times) the thickness of the protection layer 114a. For example, the thickness of the cap layer 116a is about 0.7 um, the thickness of the protection layer 114a is about 0.03 urn, and the thickness of the etch stop layer 104a is about 0.15 um.

By selecting suitable materials, thicknesses and etching parameters, the recesses R are formed with the desired shapes and sizes. In some embodiments, the maximum width W2 of the recesses R and the width W1 of the openings 119 are in a ratio of about 1:50 to 1:200, such as about 1:80 to 1:150. For example, the maximum width W2 of the recesses R is about 0.02 um, and the width W1 of the openings 119 is about 2 um.

Figure 1D:
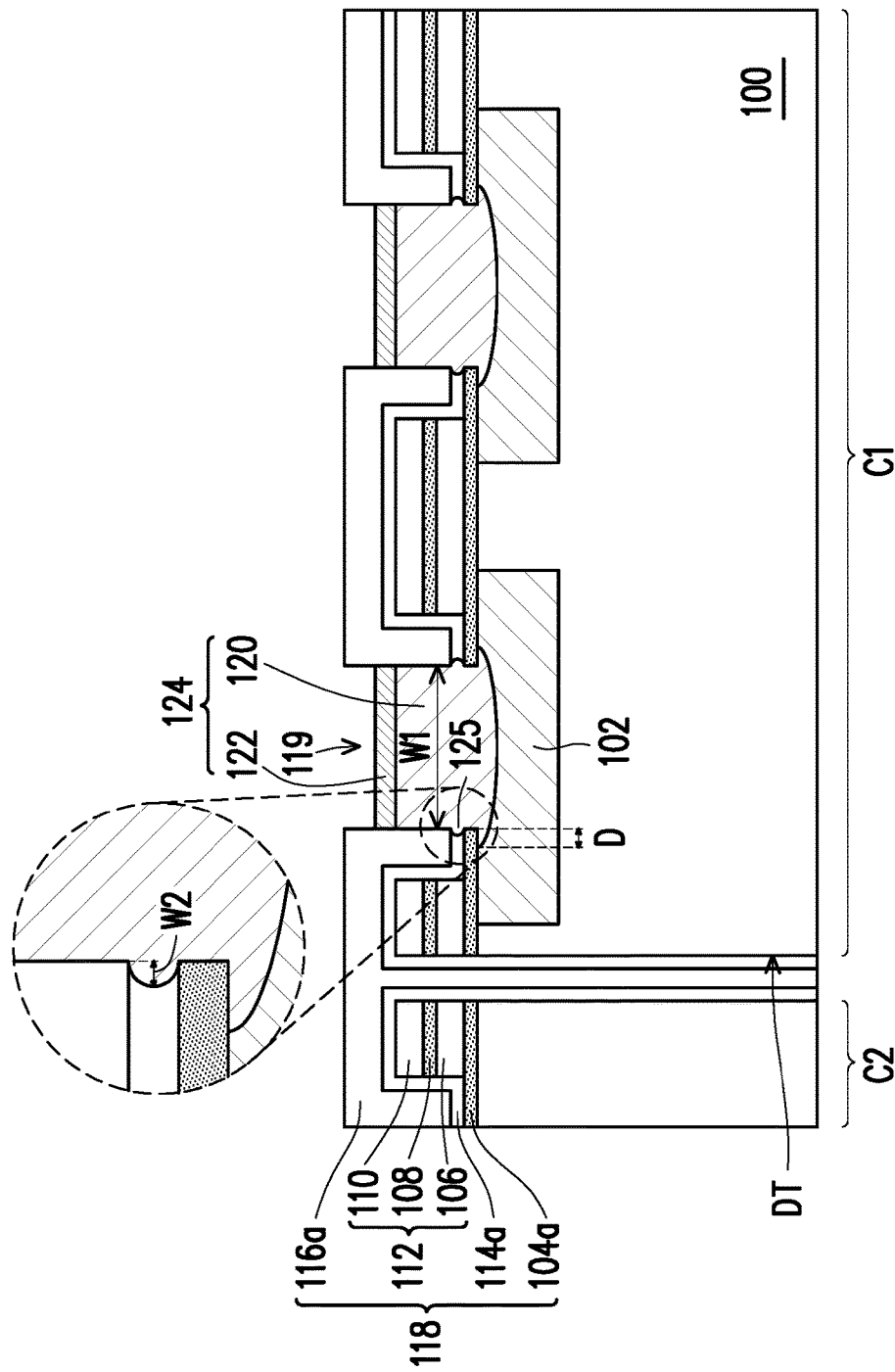

Referring to FIG. 1D, metal bumps 124 are formed in the openings 119 and the recesses R. In some embodiments, each of the metal bumps 124 has a protruding part 125, and the protruding part 125 protrudes out from the sidewall of the corresponding metal bump 124. In some embodiments, the protruding parts 125 of the metal bumps 124 are respectively formed in the recesses R and embedded by the adjacent passivation stacks 118.

In some embodiments, each of the protruding parts 125 has a curved surface. Specifically, each of the protruding parts 12 has an uneven width varying from 1 angstrom to 200 angstroms. The maximum width W2 can be, for example but not limited to, about 10 angstroms, 20 angstroms, 30 angstroms, 40 angstroms, 50 angstroms, 60 angstroms, 70 angstroms, 80 angstroms, 90 angstroms, 100 angstroms, 150 angstroms, 200 angstroms, including any range between any two of the preceding values. In some embodiments, the maximum width W2 of the protruding parts 125 and the width W1 of the metal bumps 124 are in a ratio of about 1:50 to 1:200, such as about 1:80 to 1:150. For example, the maximum width W2 of the protruding parts 125 is about 0.02 um, and the width W1 of the metal bumps 124 is about 2 um.

In some embodiments, each metal bump 124 includes a lower bump 120 and an upper bump 122 made by different materials, and the protruding part 125 protrudes out from the lower bump 120 of the metal bump 124. In some embodiments, the thickness of the upper bump 122 and the thickness of the lower bump 120 are in a ratio of about 1:2 to 1:10, such as 1:4 to 1:5. For example, the thickness of the lower bump 120 is about 0.8 um, and the thickness of the upper bump 122 is about 0.2 urn.

In some embodiments, for each metal bump 124, the lower bump 120 includes nickel and the upper bump 122 includes gold. In some embodiments, the method of forming the metal bumps 124 includes performing an electroless plating, such as an Electroless Nickel Immersion Gold (ENIG) process.

Upon the operations of FIG. 1A to FIG. 1D, in each of the chip regions C1 and C2, the first substrate 100 is formed with conductive features 102 therein, metal bumps 124 over the conductive features 102 and passivation stacks 118 aside the metal bumps 102. In some embodiments, the tops of the metal bumps 124 are lower than the tops of the passivation stacks 118.

Figure 1E:
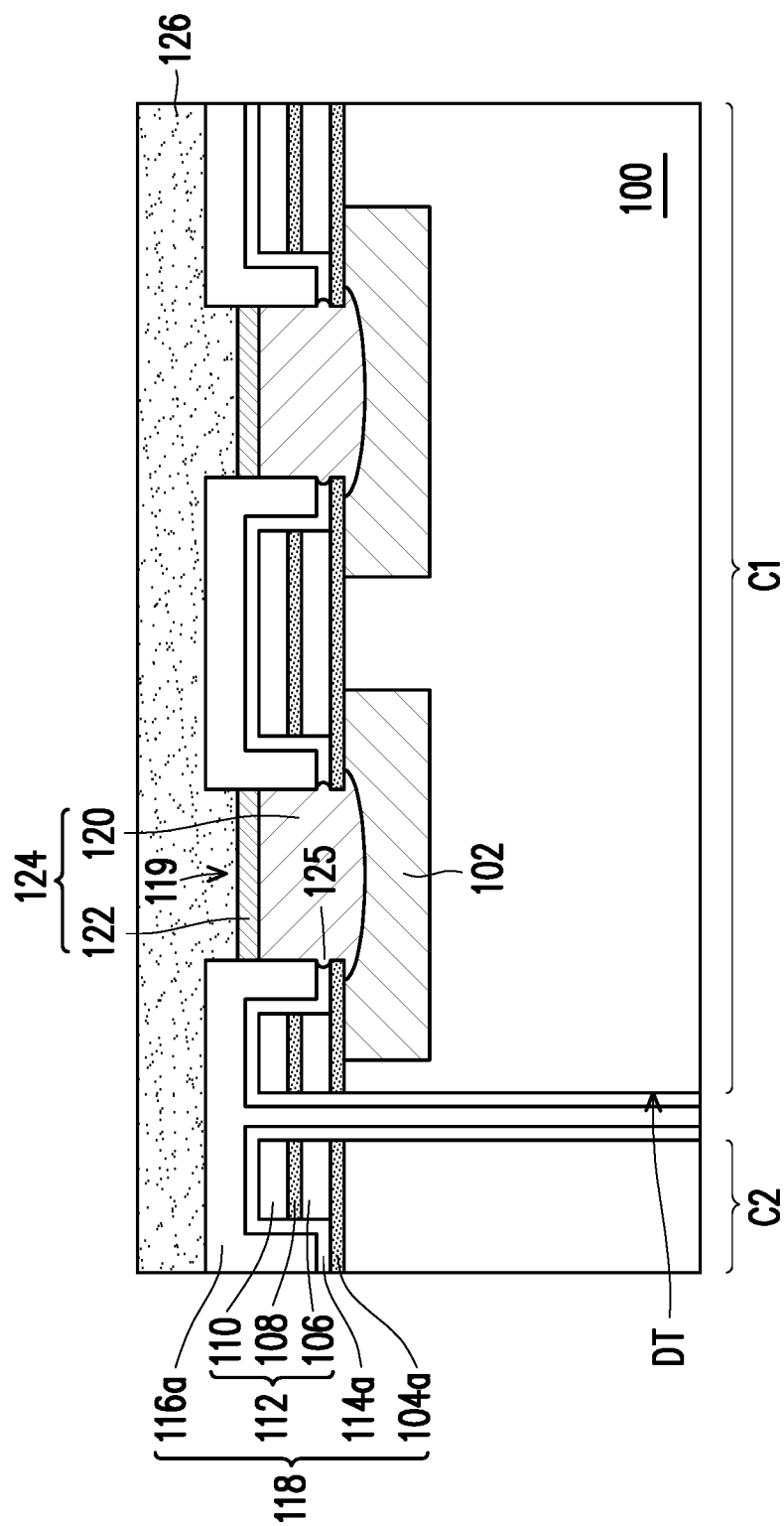

Referring to FIG. 1E, a first insulating layer 126 is formed over the metal bumps 124 and the passivation stacks 118. In some embodiments, the first insulating layer 126 may include silicon oxide (e.g., tetra-ethyl-ortho-silicate (TEOS) oxide) or a suitable insulating material. In some embodiments, the method of forming the first insulating layer 126 includes performing a suitable deposition process (e.g., CVD process) to form a first insulating material layer such as a TEOS oxide layer. Thereafter, a planarization process (e.g., chemical mechanical polishing (CMP) process) is performed to reduce oxide thickness variation across the first substrate 100. In some embodiments, more than half of the first insulating material layer is removed during the planarization process.

Figure 1F:
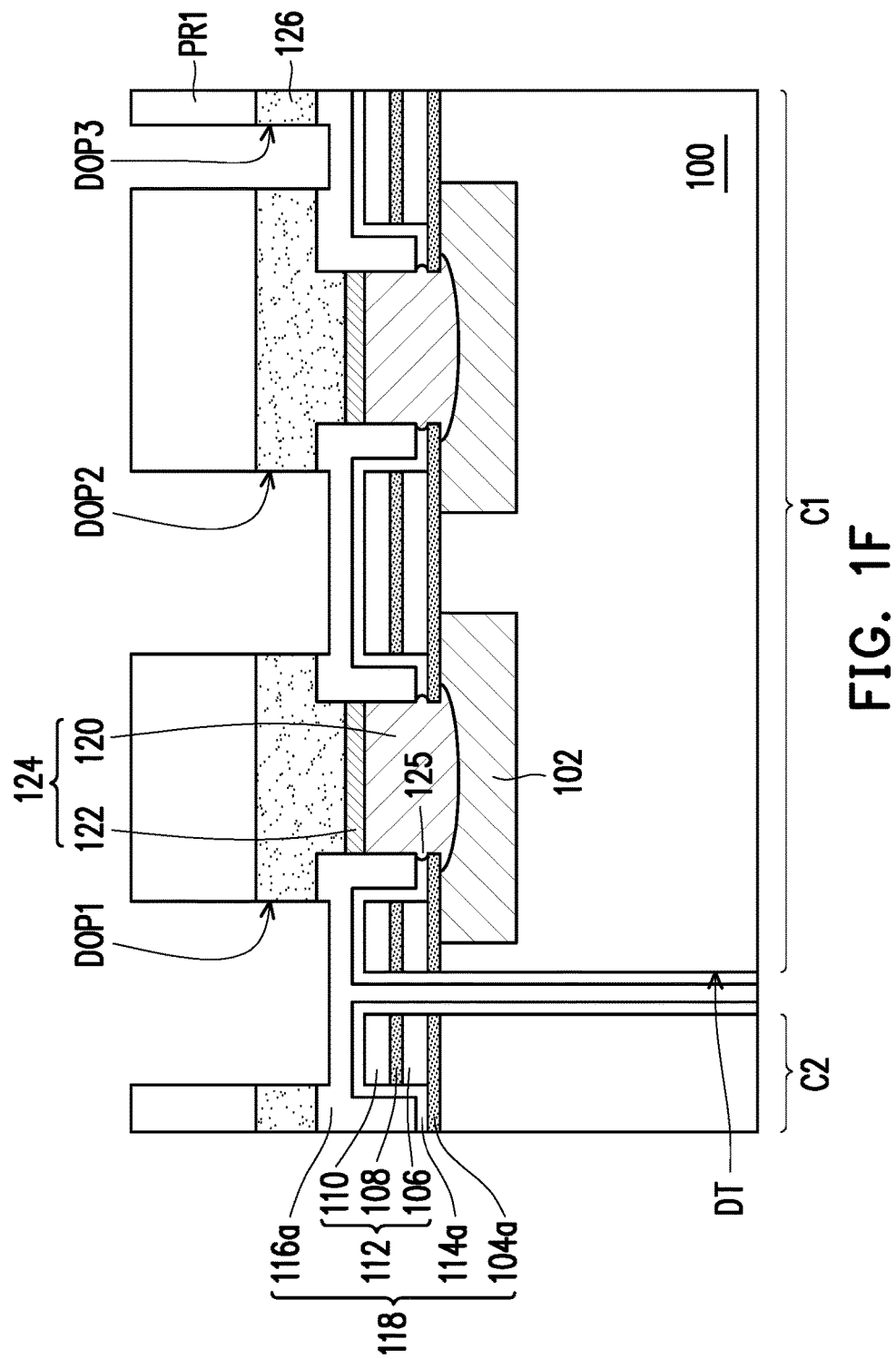
Figure 1G:
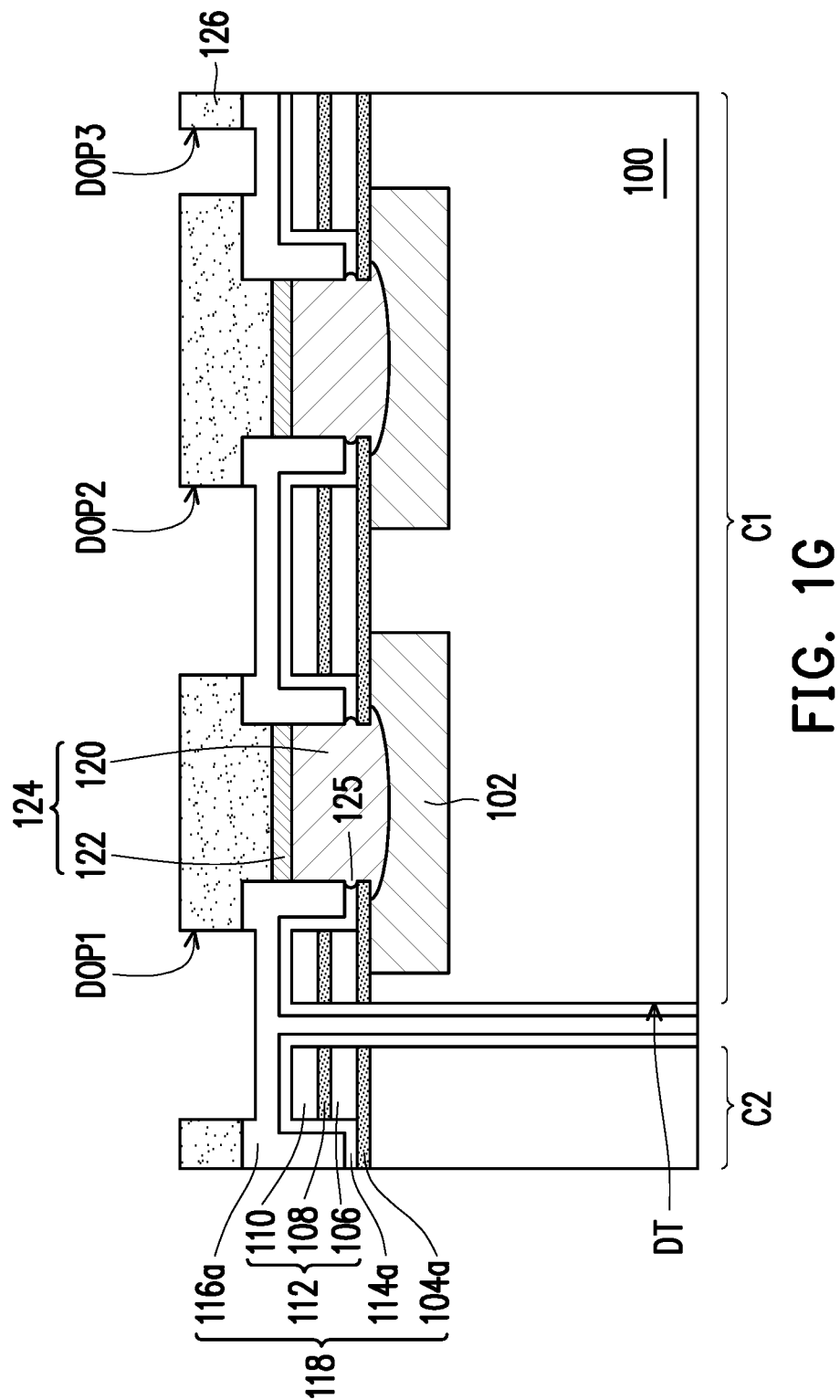

Referring to FIG. 1F to FIG. 1G, a first patterning process is performed to form one or more first opening patterns DOP1, DOP2 and DOP3 in the first insulating layer 126.

In some embodiments, as shown in FIG. 1F, a first photoresist layer PR1 is formed over the first insulating layer 126, and the first photoresist layer PR1 has first opening patterns DOP1, DOP2 and DOP3 therein. In some embodiments, the first opening patterns DOP1, DOP2 and DOP3 do not expose any metal bump 124. In some embodiments, the first opening pattern DOP1 corresponds to the deep trench DT, and the first opening patterns DOP2 and DOP3 correspond to some of the passivation stacks 118. The locations of the first opening patterns may be designed upon the process requirements, as long as the first opening patterns are configured to help an etch gas to remove oxide between substrates without damaging the metal bumps. In some embodiments, the first opening patterns may correspond to (but do not expose) some of the metal bumps as needed.

Thereafter, as shown in FIG. 1G, an etching process is performed to transfer the first opening patterns DOP1, DOP2 and DOP3 of the first photoresist layer PR1 to the underlying first insulating layer 126. The first photoresist layer PR1 is then removed.

Figure 1H:
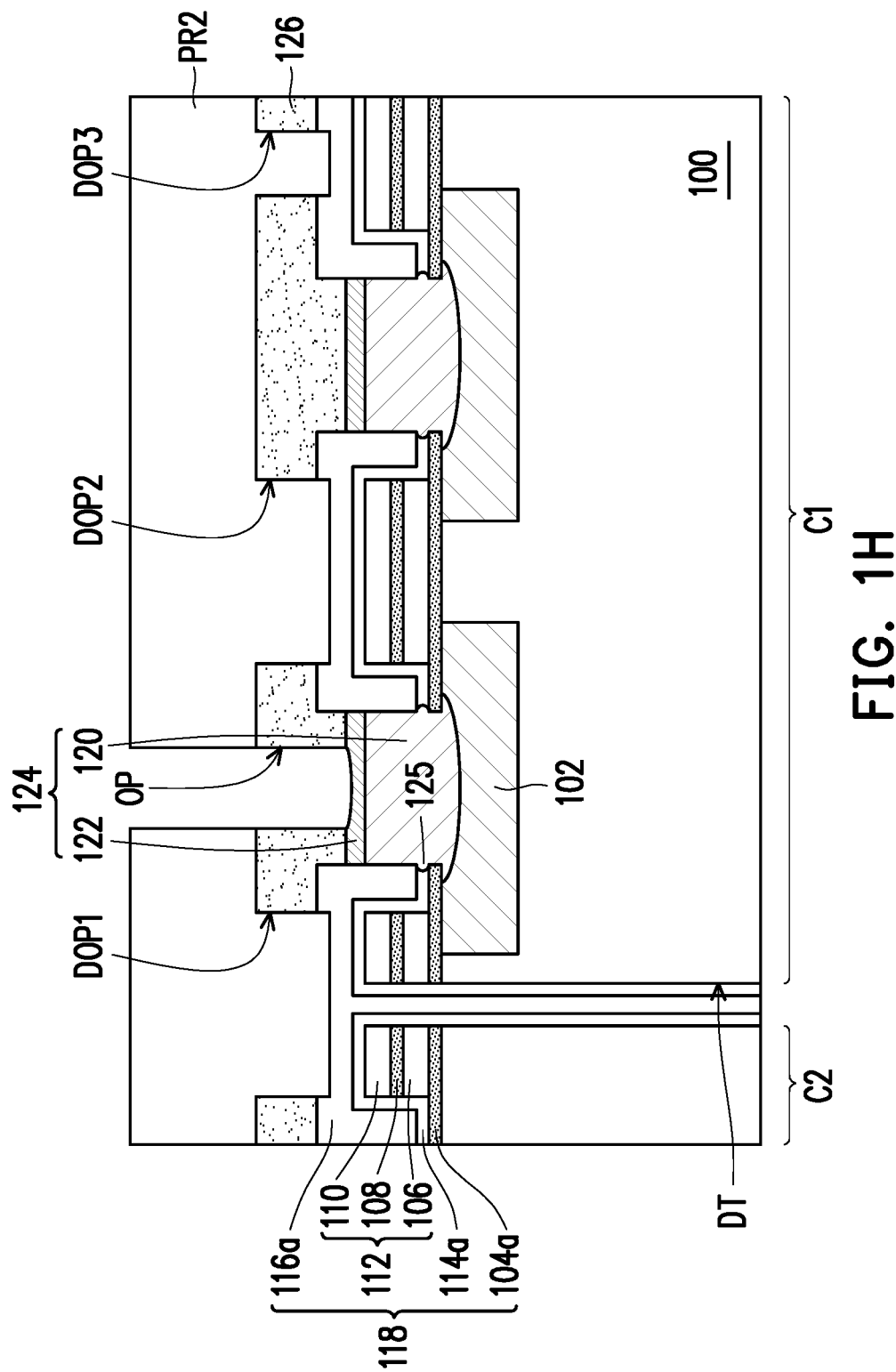
Figure 1I:
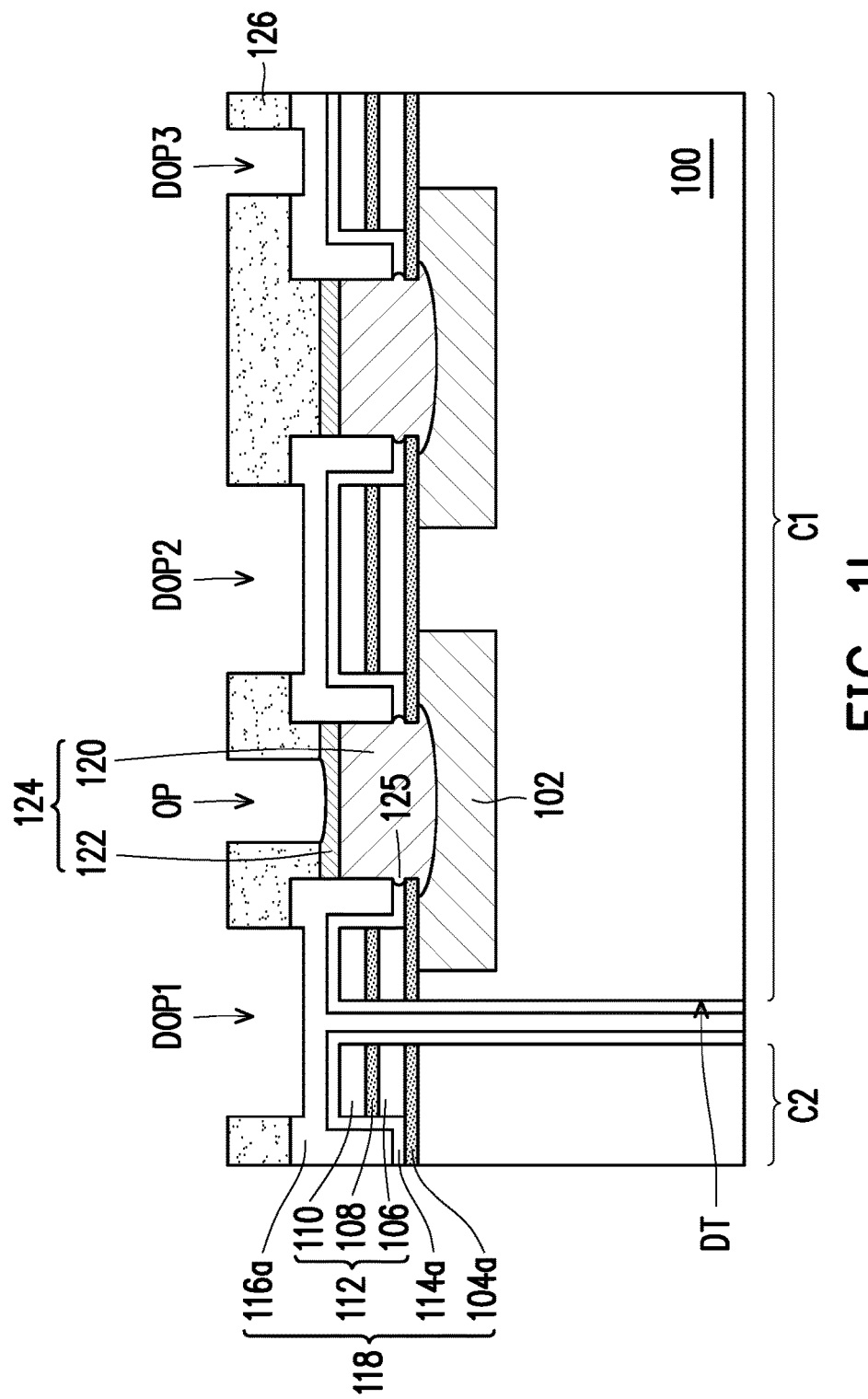

Referring to FIG. 1H to FIG. 1I, a second patterning process is performed to form at least one second opening pattern OP in the first insulating layer 126.

In some embodiments, as shown in FIG. 1H, a second photoresist layer PR2 is formed over the first insulating layer 126 and fills in the first opening patterns DOP1, DOP2 and DOP3. In some embodiments, the second photoresist layer PR2 has one or more second opening patterns OP therein. In some embodiments, at least one of the second opening patterns OP exposes one of the metal bumps 124. In some embodiments, the first photoresist layer PR1 and the second photoresist layer PR2 include the same photoresist material. In alternative embodiments, the first photoresist layer PR1 and the second photoresist layer PR2 include different photoresist materials.

Thereafter, as shown in FIG. 1I, an etching process is performed to transfer the second opening pattern OP of the second photoresist layer PR2 to the underlying first insulating layer 126. In some embodiments, the etching process may etch away the surface portion of the underlying metal bump 124 exposed by the second opening pattern OP, and thus, the remaining metal bump 124 is formed with a curved top. The second photoresist layer PR2 is then removed.

It is noted that, not all of the metal bumps 124 are exposed by the second patterning process, and thus, not all of the metal bumps 124 are formed with curved tops. Specifically, as shown in FIG. 1I, the left metal bump 124 exposed by the second patterning process is formed with a curved top, while the right metal bump 124 not exposed by the second patterning process is formed with a substantially planar top.

In some embodiments, the second patterning process is performed after the first patterning process, and the second patterning process exposes at least one metal bump 124 but not all of the metal bumps 124. However, the present disclosure is not limited thereto. In alternative embodiments, the second patterning process is performed before the first patterning process, and the second patterning process exposes at least one metal bump 124 but not all of the metal bumps 124.

The above embodiments in which the first and second opening patterns are respectively formed by first and second patterning processes are provided for illustration purposes, and are not construed as limiting the present disclosure. In some embodiments, by adjusting the pattern sizes and/or etch parameters, the first and second opening patterns may be formed simultaneously by the same patterning process.

In some embodiments, the second opening patterns are referred to as functional opening patterns throughout the description, because they are configured for the subsequently singulation operation, which will be described in details in FIG. 1J to FIG. 1M. In some embodiments, the first opening patterns are referred to as dummy opening patterns throughout the description, because they are configured for helping an etch gas to distribute uniformly between the substrates, but rather for the subsequently singulation operation, which will be described in details in FIG. 1J to FIG. 1M.

In some embodiments, the dimension of at least one of the first opening patterns DOP1, DOP2 and DOP3 is different from the dimension of the second opening patterns OP. For example, the dimension includes a depth, a width, a length or a combination thereof.

In some embodiments, as shown in the cross-sectional view of FIG. 1I, the depths of the first opening patterns DOP1, DOP2 and DOP3 are different from the depth of the second opening pattern OP. For example, the second opening pattern OP is formed deeper than the first opening patterns DOP1, DOP2 and DOP3. From another point of view, the bottoms of the first opening patterns DOP1, DOP2 and DOP3 are at a height level different from the height level of the bottom of the second opening pattern OP. In some embodiments, the bottoms of the first opening patterns DOP1, DOP2 and DOP3 are disposed at a level higher than the level of the second opening pattern OP.

The widths and/or lengths of the first opening patterns DOP1, DOP2 and DOP3 may be varied and different from the width and/or length of the second opening pattern OP. In some embodiments, as shown in the cross-sectional view of FIG. 1I and the top view of FIG. 2, the widths and/or lengths of the first opening patterns DOP1 and DOP2 are greater than the width and/or length of second opening pattern OP, while the width and/or length of the first opening pattern DOP3 is less than the width and/or length of second opening pattern OP. However, the present disclosure is not limited thereto. In some embodiments, the width and/or length of at least one of the first opening patterns may be the same as the width and/or length of the second opening pattern.

Figure 2:
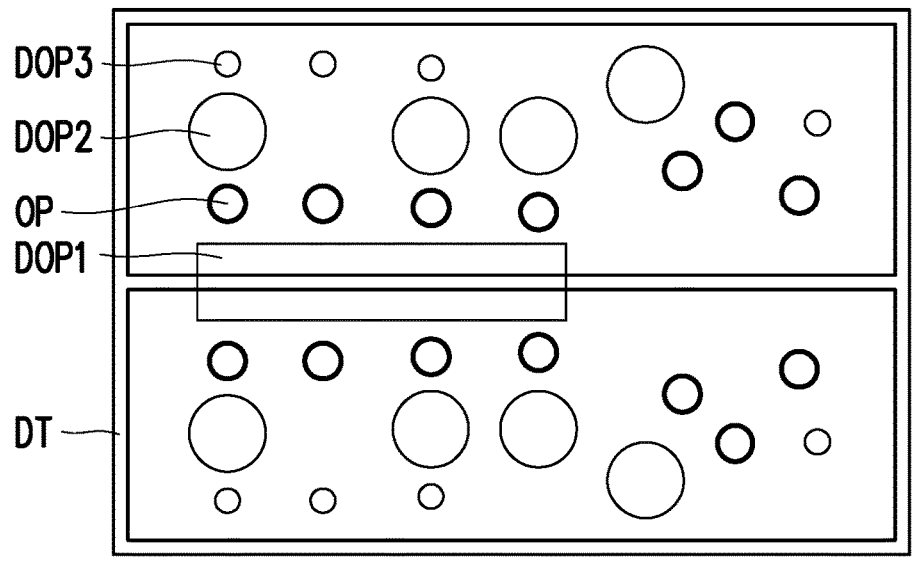
FIG. 2 is a simplified top view illustrating a stage of a method of forming a semiconductor device in accordance with some embodiments.

In some embodiments, each of the first opening patterns DOP1, DOP2 and DOP3 has a shape of a circle, a rectangle, a bar, a polygon or a combination thereof. For example, as shown in FIG. 2, the first opening pattern DOP1 corresponds to the deep trench DT and has a rectangular shape, and the first opening patterns DOP2 and DOP3 correspond to the passivation stacks 118 and have a circular shape.

Figure 3:
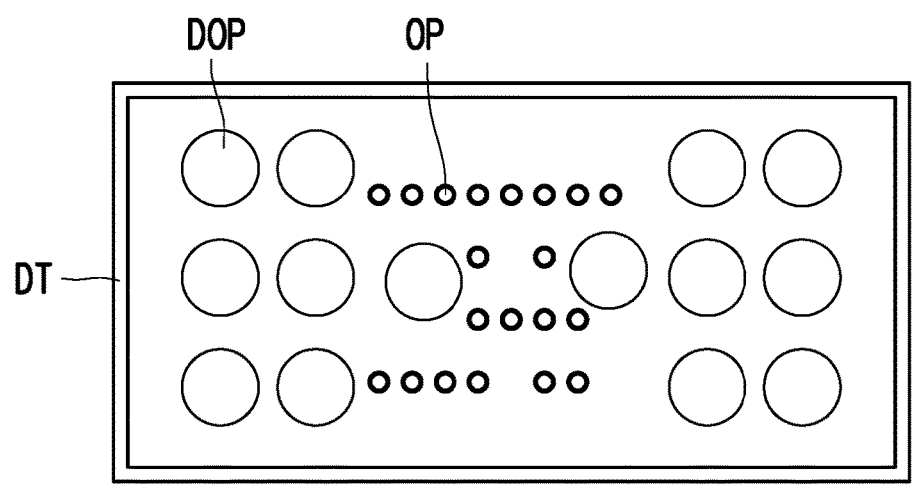
FIG. 3 is a simplified top view illustrating a stage of a method of forming a semiconductor device in accordance with alternative embodiments.
Figure 4:
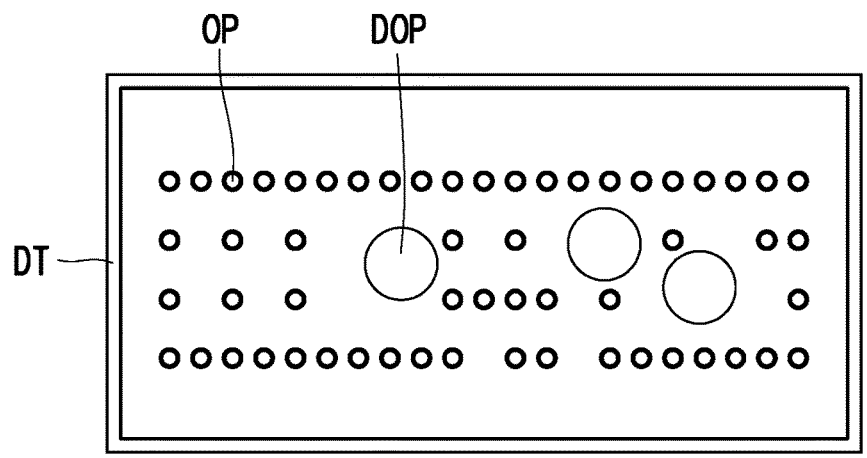
FIG. 4 is a simplified top view illustrating a stage of a method of forming a semiconductor device in accordance with yet alternative embodiments.

At least some of the first opening patterns DOP may have a shape the same as that of the second opening patterns OP. In some embodiments, as shown in FIG. 3 and FIG. 4, the first opening patterns DOP and second opening patterns OP are circular. In some embodiments, the first opening patterns DOP may be formed bigger and shallower than the second opening patterns OP.

Figure 5:
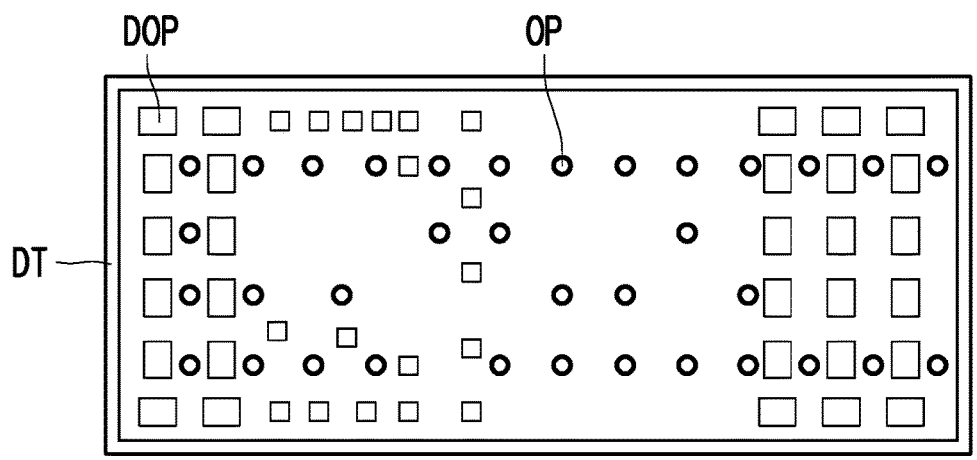
FIG. 5 is a simplified top view illustrating a stage of a method of forming a semiconductor device in accordance with still alternative embodiments.

At least some of the first opening patterns DOP may have a shape different from that of the second opening patterns OP. In some embodiments, as shown in FIG. 5, the first opening patterns DOP are rectangular, while the second opening patterns OP are circular.

The locations and distributions of the first opening patterns DOP can be designed upon the process requirements. In some embodiments, as shown in FIG. 3, the first opening patterns DOP are disposed at outer sides of the second opening patterns OP. In alternative embodiments, as shown in FIG. 4, the first opening patterns DOP are surrounded by the second opening patterns OP.

It is appreciated by people having ordinary skill in the art that other combinations and configurations of the first opening patterns are possible. In some embodiments, the first opening patterns are distributed evenly in the chip region. In alternative embodiments, the first opening patterns are distributed randomly and unevenly in the chip region. The shapes, sizes, variations, configurations and distributions of the first opening patterns are not limited by the present disclosure.

Figure 1J:
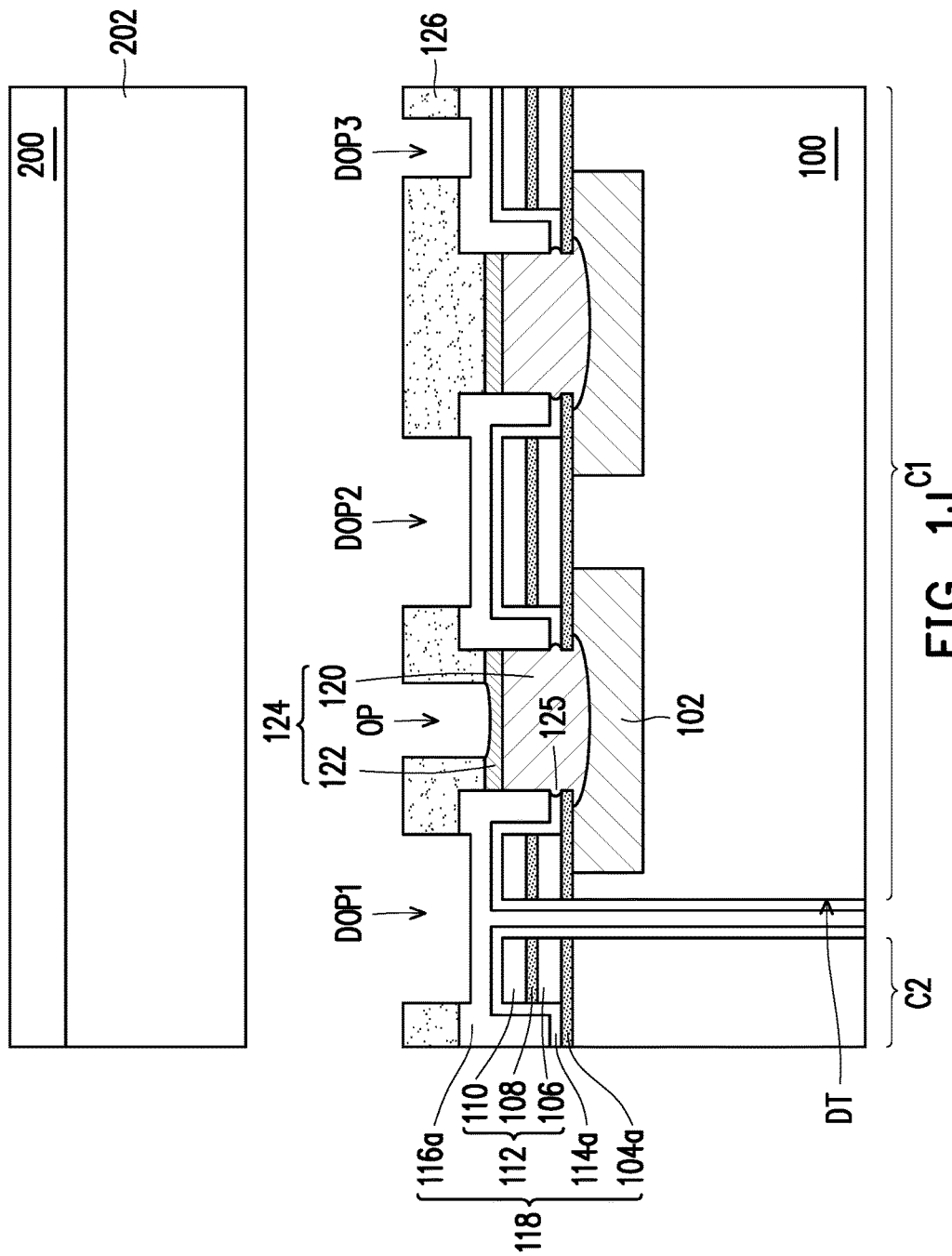

Referring to FIG. 1J, a second substrate 200 is provided with a second insulating layer 202 thereon. In some embodiments, the second substrate 200 includes a silicon-containing substrate, a silicon-on-insulator (SOI) substrate, or a substrate formed of other suitable semiconductor materials. In some embodiments, the second substrate 200 is a blank carrier without patterns. In some embodiments, the second insulating layer 202 may include a photo-sensitive material such as polybenzoxazole (PBO), polyimide, benzocyclobutene (BCB), a combination thereof or the like. In alternative embodiments, the second insulating layer 202 may include a suitable insulating material having a high etch selectivity with respect to oxide.

Figure 1K:
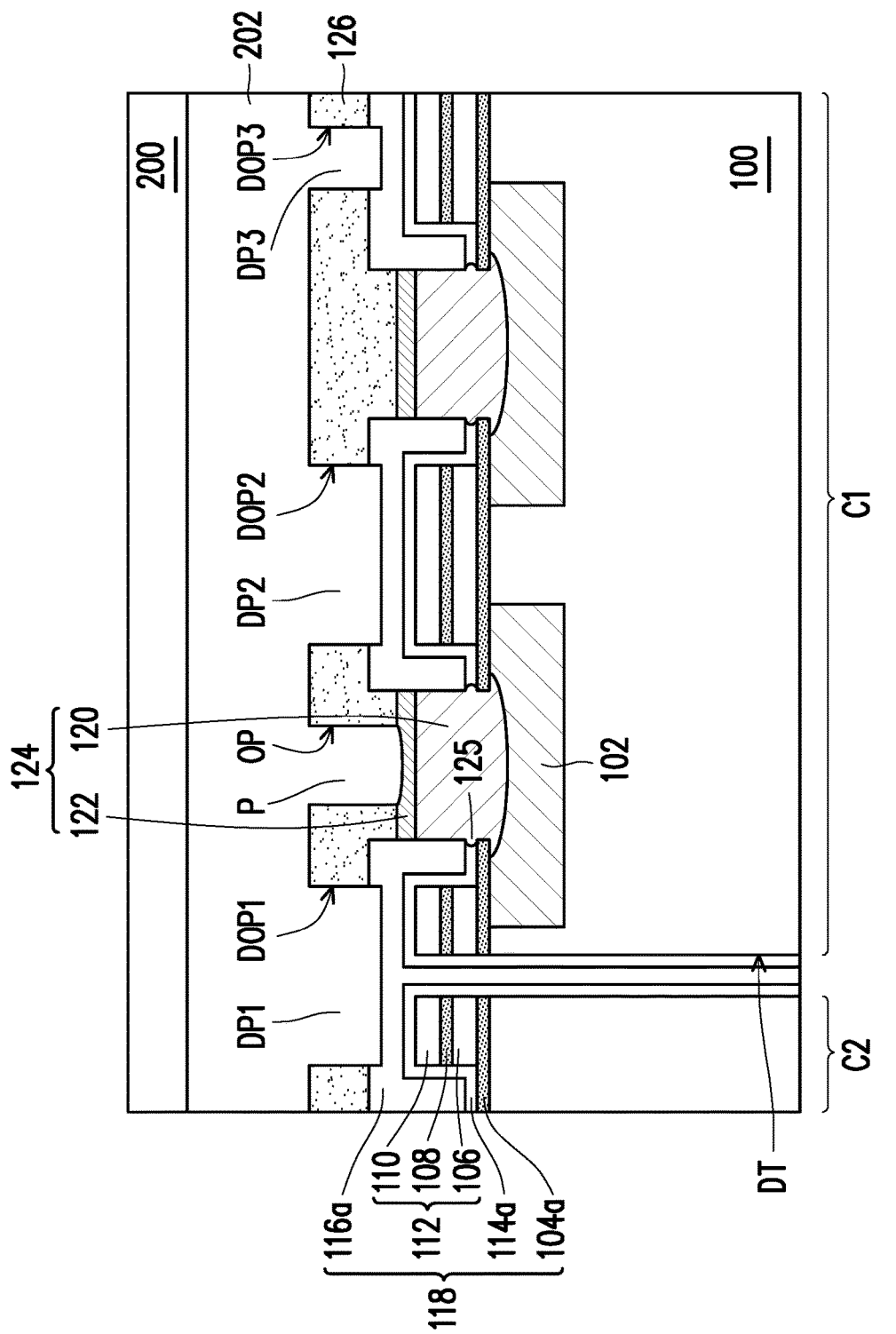

Referring to FIG. 1K, the second substrate 200 is bonded to the first substrate 100 with the second insulating layer 202 and the first insulating layer 126 facing each other. In some embodiments, the second substrate 200 is pressed against the first substrate 100, so that the second insulating layer 202 fills in the first opening patterns DOP1, DOP2 and DOP3 and the second opening pattern OP of the first insulating layer 126. Specifically, during the pressing operation, the first opening patterns DOP1, DOP2 and DOP3 and the second opening pattern OP of the first insulating layer 126 are transferred to the second insulating layer 202, and thus, the second insulating layer 202 is formed with dummy patterns DP1, DP2 and DP3 and a functional pattern P that protrude away from the second substrate 200. The shapes of the dummy patterns DP1, DP2 and DP3 and the functional pattern P correspond to the shapes of the first opening patterns DOP1, DOP2 and DOP3 and the second opening pattern OP. A curing operation may be needed after the pressing operation.

Figure 1L:
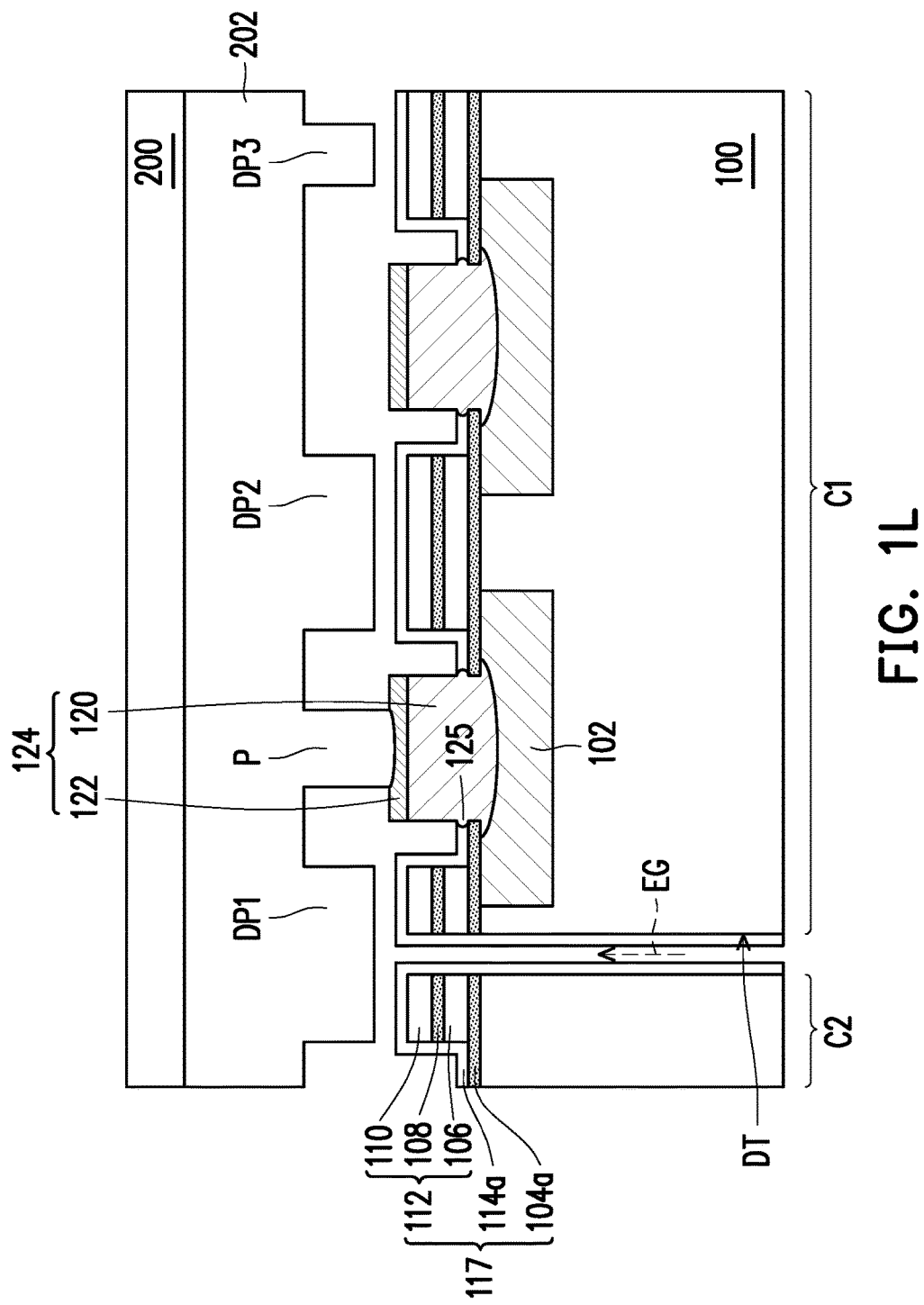

Referring to FIG. 1L, the first insulating layer 126 and portions of the passivation stacks 118 are removed. In some embodiments, the first insulating layer 126 and the cap layers 116a of the passivation stacks 118 are removed by flowing an etch gas EG from the deep trench DT. In some embodiments, the etch gas EG is configured to etch away oxide in the deep trench DT and oxide between the first substrate 100 and the second substrate 200. In some embodiments, the etch gas EG includes a fluorine-containing etch gas, such as vapor hydrofluoric acid (VHF). In some embodiments, the oxide removing operation of FIG. 1L is referred to as a VHF process throughout the description. In some embodiments, after the VHF process of FIG. 1L, passivation stacks 117 and metal bumps 124 are alternately arranged in a lateral direction. In some embodiments, each of the passivation stacks 117 includes an etch stop layer 104a, a stacked structure 112 and a protection layer 114a. The etch stop layer 104a and the protection layer 114a are in physical contact with the corresponding metal bump 124, and the stacked structure 112 is between the etch stop layer 104a and the protection layer 114a and separated from the corresponding metal bump 124.

It is noted that, in some embodiments, the dummy patterns DP1, DP2 and DP3 enable etching of the cap layers 116a over and between the chip regions C1 and C2 and etching of the first insulating layer 126 without cracking the passivation stacks 117 or damaging the metal bumps 124. In some embodiments, after the VHF process of FIG. 1L, the deep trench DT is free of oxide and functions as a singulation area or a separating region.

In some embodiments, upon the oxide removing operation, the functional pattern P of the second insulating layer 202 is in physical contact with one of the metal bumps 124, while the dummy patterns DP1, DP2 and DP3 of the second insulating layer 202 are separated from the underlying structure. From another point of view, the dummy patterns DP1, DP2 and DP3 of the second insulating layer 202 are structured as a "stalactite" suspended downwardly from the second substrate 200.

Figure 1M:
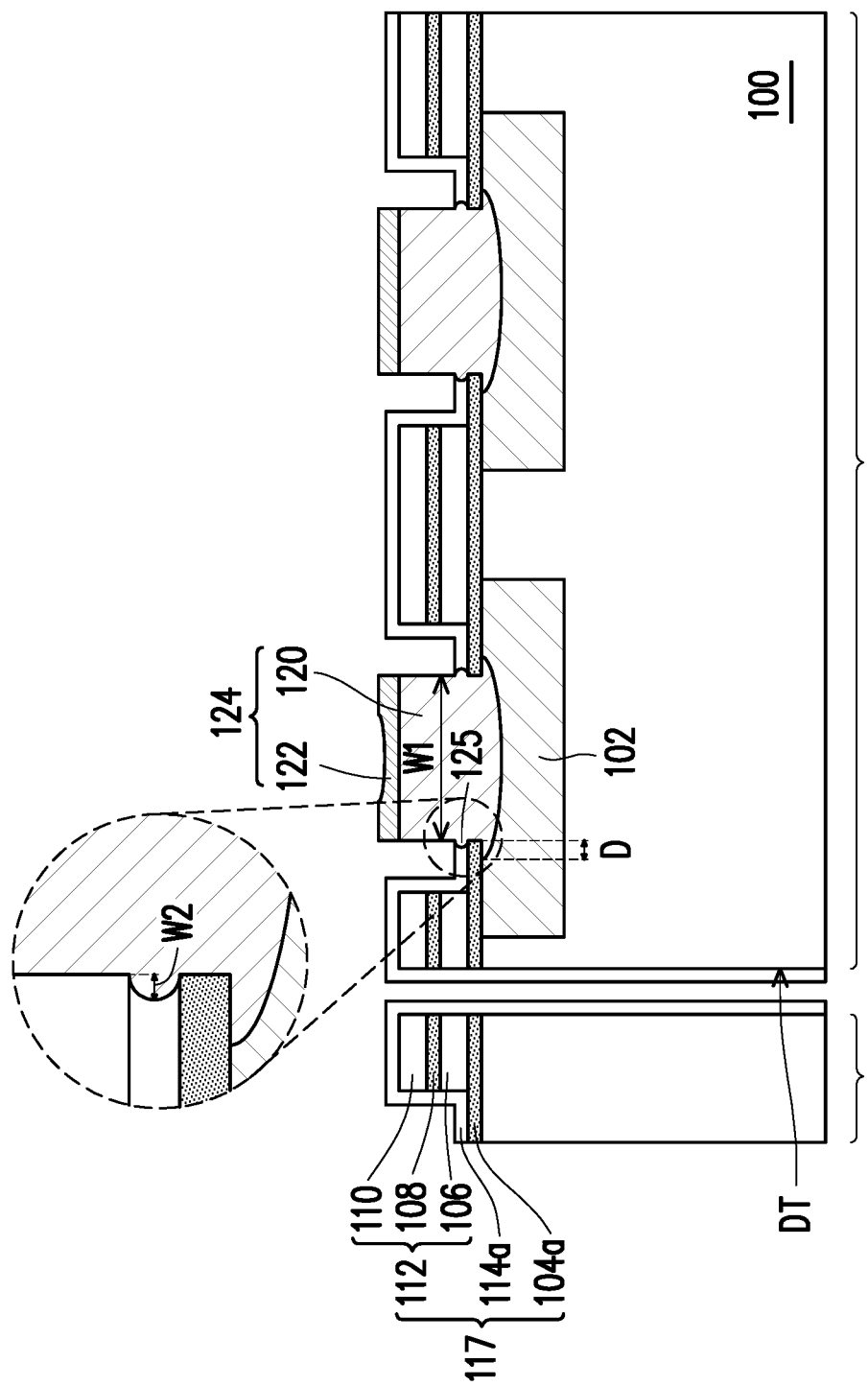

Referring to FIG. 1M, the second substrate 200 is debonded from the first substrate 100, so as to separate the two chip regions C1 and C2 from each other. In some embodiments, the chip regions C1 and C2 are singulated from each other after separating the function pattern P of the second substrate 200 from the corresponding metal bump 124 of the first substrate 100. In some embodiments, the debonding operation is referred to as a singulation process throughout the description. The semiconductor device of the present disclosure is thus completed. In some embodiments, the semiconductor device may include a power device, such as a display driver.

In some embodiments, the stalactite layout of dummy patterns guide the VHF gas flow and reduce oxide etching amount of the VHF process. Therefore, the VHF etching time is greatly reduced, and VHF etching window is significantly improved without cracking the passivation stacks or damaging the metal bumps.

The semiconductor device of the present disclosure is illustrated below with reference to FIG. 1M.

Referring to FIG. 1M, a semiconductor device includes a first substrate 100, one or more conductive features 102, one or more metal bumps 124 and one or more passivation stacks 117. The conductive features 102 are disposed in the first substrate 100. In some embodiments, the conductive features 102 are patterns of the top metal layer of an interconnection structure. The metal bumps 124 are disposed over and electrically connected to the conductive features 102. The passivation stacks 117 are disposed over the first substrate 100 and aside the metal bumps 124. In some embodiments, each of the passivation stacks 117 includes an etch stop layer 104a, a stacked structure 112 and a protection layer 114a. The etch stop layer 104a contacts the corresponding metal bump 124. The stacked structure 112 is disposed over the etch stop layer 104a and separated from the metal bump 124. The stacked structure 112 includes first dielectric layers 106 and 110 and a second dielectric layer 108 between the first dielectric layers 106 and 110. The protection layer 114a encapsulates the top and the sidewall of the stacked structure 112 and contacts the corresponding metal bump 124.

In some embodiments, each of the metal bumps 124 has a protruding part 125, and the protruding part 125 protrudes out from the sidewall of the metal bump 124 and is separated from the conductive feature 102. In some embodiments, the protruding parts 125 of the metal bumps 124 are embedded in the adjacent passivation stacks 117. In some embodiments, the maximum width W2 of the protruding parts 125 and the width W1 of the metal bumps 124 are in a ratio of about 1:50 to 1:200, such as about 1:80 to 1:150.

In some embodiments, each of the metal bumps 124 has a curved bottom that extends under a portion of the adjacent passivation stack 112. In some embodiments, the extending distance D of the bottom edge of each metal bump 124 and the width W1 of the metal bump 124 are in a ratio of about 1:3 to 1:15, such as about 1:6 to 1:8.

In some embodiments, each of the metal bumps 124 includes a lower bump 120 and an upper bump 122 made by different materials, and the protruding part 125 protrudes out from the lower bump 120 of the metal bump 124. In some embodiments, the lower bump 120 includes nickel and the upper bump 122 includes gold.

In some embodiments, at least one of the metal bumps 124 has a curved top, while at least one of the metal bumps 124 has a substantially planar top, as shown in FIG. 1M.

In some embodiments, for each metal bump 124, the bottom edge part below the passivation stack 117 and the protruding part 125 embedded in the passivation stack 117 serve as two barriers that prevent the underlying copper (e.g., conductive feature 102) from diffusing into the gold (e.g., upper bump 122). By such manner, the metal bumps 124 and therefore the semiconductor device are provided with improved performance.

In accordance with some embodiments of the present disclosure, a method of forming a semiconductor device includes following operations. A first substrate is provided with a conductive feature therein, a first metal bump over the conductive feature and a passivation stack aside the first metal bump. A first insulating layer is formed over the first metal bump and the passivation stack. A first patterning process is performed to form a first opening pattern in the first insulating layer. A second patterning process is performed to form a second opening pattern in the first insulating layer. In some embodiments, the first metal bump is exposed by the second patterning process. A second substrate is provided with a second insulating layer thereon. The second substrate is bonded to the first substrate with the second insulating layer and the first insulating layer facing each other, so that the second insulating layer fills in the first and second opening patterns of the first insulating layer. The first insulating layer and a portion of the passivation stack are removed In accordance with alternative embodiments of the present disclosure, a method of forming a semiconductor device includes following operations. A first substrate is provided with at least two chip regions separated by an insulating deep trench. The first substrate has, in each chip region, a conductive feature therein, a metal bump over the conductive feature and a passivation stack aside the metal bump. A first insulating layer is formed over the metal bumps and the passivation stacks. The first insulating layer are patterned to form a first opening pattern and a second opening pattern therein. In some embodiments, a bottom of the first opening pattern and a bottom of the second opening pattern are at different height levels. A second substrate is provided with a second insulating layer thereon. The second substrate is bonded to the first substrate with the second insulating layer and the first insulating layer facing each other, so that the second insulating layer fills in the first and second opening patterns of the first insulating layer. The first insulating layer and portions of the passivation stacks are removed by flowing an etch gas from the insulating deep trench.

In accordance with yet alternative embodiments of the present disclosure, a semiconductor device includes a conductive feature, a metal bump and a passivation stack. The conductive feature is disposed in a substrate. The metal bump is disposed over and electrically connected to the conductive feature. In some embodiments, the metal bump has a protruding part, and the protruding part protrudes out from a sidewall of the metal bump and is separated from the conductive feature. The passivation stack is disposed over the substrate and aside the metal bump.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a first substrate having a conductive feature therein, a first metal bump over the conductive feature and a passivation stack aside the first metal bump;
   forming a first insulating layer over the first metal bump and the passivation stack;
   performing a first patterning process to form a first opening pattern in the first insulating layer;
   performing a second patterning process to form a second opening pattern in the first insulating layer, wherein the first metal bump is exposed by the second patterning process;
   providing a second substrate having a second insulating layer thereon;
   bonding the second substrate to the first substrate with the second insulating layer and the first insulating layer facing each other, so that the second insulating layer fills in the first and second opening patterns of the first insulating layer; and
   removing the first insulating layer and a portion of the passivation stack.

2. The method of claim 1, wherein a dimension of the first opening pattern is different from a dimension of the second opening pattern.

3. The method of claim 2, wherein the dimension comprises a depth, a width, a length or a combination thereof.

4. The method of claim 1, wherein a shape of the first opening pattern is different from a shape of the second opening pattern.

5. The method of claim 1, wherein a shape of the first opening pattern is the same as a shape of the second opening pattern.

6. The method of claim 1, wherein the first substrate further has a second metal bump aside the passivation stack, and the second metal bump is not exposed by the second patterning process.

7. The method of claim 1, wherein the second patterning process is performed after the first patterning process.

8. The method of claim 1, wherein the first metal bump has a protruding part, and the protruding part of the first metal bump is embedded in the passivation stack and separated from the conductive feature.

9. A method of forming a semiconductor device, comprising:
 providing a first substrate having at least two chip regions separated by an insulating deep trench, wherein the first substrate has, in each chip region, a conductive feature therein, a metal bump over the conductive feature and a passivation stack aside the metal bump;
 forming a first insulating layer over the metal bumps and the passivation stacks;
 patterning the first insulating layer to form a first opening pattern and a second opening pattern therein, wherein a bottom of the first opening pattern and a bottom of the second opening pattern are at different height levels;
 providing a second substrate having a second insulating layer thereon;
 bonding the second substrate to the first substrate with the second insulating layer and the first insulating layer facing each other, so that the second insulating layer fills in the first and second opening patterns of the first insulating layer; and
 removing the first insulating layer and portions of the passivation stacks by flowing an etch gas from the insulating deep trench.

10. The method of claim 9, further comprising debonding the second substrate from the first substrate, so as to separate the chip regions from each other.

11. The method of claim 9, wherein the metal bump is exposed by one of the first opening pattern and the second opening pattern.

12. The method of claim 9, wherein the first opening pattern has a shape of a circle, a rectangle, a bar, a polygon or a combination thereof.

13. The method of claim 9, wherein the first opening pattern corresponds to the insulating deep trench or at least one of the passivation stacks.

14. The method of claim 9, wherein the metal bump has, in each chip region, a curved bottom that extends under a portion of the passivation stack.

* * * * *